United States Patent [19]

Carpenter et al.

[11] Patent Number: 5,177,374
[45] Date of Patent: Jan. 5, 1993

[54] CURRENT MODE GATE DRIVE FOR POWER MOS TRANSISTORS

[75] Inventors: Gary D. Carpenter, Lexington; Martin B. Lundberg, Richmond, both of Ky.

[73] Assignee: International Business Machines Corporation, Armonk, N.Y.

[21] Appl. No.: 592,148

[22] Filed: Oct. 3, 1990

[51] Int. Cl.⁵ .......................... H03K 5/12; H03K 3/26; H03K 5/153
[52] U.S. Cl. ...................................... 307/270; 307/263; 307/350
[58] Field of Search ............... 330/253, 277, 273, 274, 330/267, 268, 285; 307/263, 300, 571, 584, 577, 304, 228; 328/183, 184, 185

[56] References Cited

U.S. PATENT DOCUMENTS

| | | | |
|---|---|---|---|
| 3,395,293 | 7/1968 | Perloff | 328/183 |
| 3,621,281 | 11/1971 | Hagen et al. | 328/183 |
| 3,984,780 | 5/1976 | Hsiao et al. | 330/253 |
| 4,047,059 | 9/1977 | Rosenthal | 307/355 |
| 4,333,058 | 6/1982 | Hoover | 330/253 |
| 4,449,059 | 5/1984 | Dickes | 328/185 |
| 4,536,662 | 8/1985 | Fujii | 307/270 |
| 4,697,154 | 9/1987 | Kousaka et al. | 307/270 |
| 4,730,168 | 3/1988 | Senderowicz et al. | 330/253 |
| 4,835,417 | 5/1989 | Kousaka et al. | 307/362 |
| 4,853,563 | 8/1989 | Hill et al. | 307/270 |
| 4,868,518 | 9/1989 | Blanken et al. | 330/277 |
| 4,874,969 | 10/1989 | Meadows | 307/355 |
| 4,893,091 | 1/1990 | Lillis et al. | 330/268 |
| 4,931,676 | 5/1990 | Baiocchi et al. | 307/571 |
| 4,967,101 | 10/1990 | Nakamura et al. | 307/270 |
| 5,019,719 | 5/1991 | King | 307/571 |

Primary Examiner—Janice A. Howell
Assistant Examiner—Sinh Tran
Attorney, Agent, or Firm—William H. Steinberg

[57] ABSTRACT

A power amplifier having a power MOS transistor output device. The gate drive for the power device is a bidirectional current source. In one form of the gate driver circuit, the bidirectional current source includes the capability of controlling the liimts of the gate current, which in turn controls the slew rate of the power amplifier.

6 Claims, 5 Drawing Sheets

CURRENT MODE GATE DRIVE FOR POWER MOS TRANSISTORS

FIELD OF THE INVENTION

The invention relates generally to drivers for power MOSFET's.

BACKGROUND OF THE INVENTION

A linear power amplifier requires the use of a high and a low side power transistor operating in a class B or AB mode. These power devices are usually driven by a low impedance voltage mode driver which must have sufficient drive capacity so that the large input capacitance of the power device does not affect the driver performance. This topology has several problems when using MOS transistors as the power devices, particularly in an integrated circuit application and/or when an all NMOS bridge is used. Among those problems are:

The gate driver must have sink and source capability since the input gate impedance is capacitive. In order to maintain a constant output current in the power device, the gate voltage must be held constant with zero current. If a class A gate driver is used, the result is very inefficient. If a class AB gate driver is used, higher efficiency is achieved, but crossover distortion in the driver results in non-linearity in the transfer function and possible loss of control under steady state conditions.

High gain and dominant pole compensation must be added to the input stage of the amplifier to make it usable in closed loop configurations. The integration of the compensation capacitor requires a relatively large amount of silicon area.

Power stage slew rate cannot be independently controlled. The slew rate of the power stage will either be controlled by the output impedance of the gate driver, or the internal compensation node. In either case, the slew rate cannot be independently controlled.

A floating voltage mode gate driver with low output impedance is needed to drive the high side power device. Since an NMOS transistor is much smaller (i.e., cheaper) than an equivalent PMOS transistor, it is very desirable to use NMOS transistors in both high and low side applications. Since the source of the NMOS transistor is floating when used as a high side power device, the gate driver must also be floating. This requires complex level shifting circuits in order to use a voltage mode driver.

It is an objective of the invention to provide a driver for a power MOS transistor that overcomes the foregoing disadvantages.

SUMMARY OF THE INVENTION

In accordance with one aspect of the invention, there is provided a bidirectional current source driver in combination with a power MOSFET.

The use of a high impedance, current source drive provides significant advantages. These include:

Current sources are easily integrated. Current sources provide an easy way of level shifting drive signals to a floating power device. A current source gate drive combined with the input capacitance on a MOS power device provides a very high gain circuit. A current source gate drive combined with the input capacitance on a MOS power device provides dominant pole compensation which eliminates the need for an additional compensation capacitor in the loop. Slew rate may be controlled independent of the small signal transfer function by limiting or enhancing the maximum gate drive current under large signal conditions. Current mode gate drive allows for a simple sink/source gate driver with no crossover distortion.

Other objects and advantages of the invention, and the manner of their implementation, will become apparent upon reading the following detailed description and upon reference to the drawings in which:

DETAILED DESCRIPTION

Figure 1:
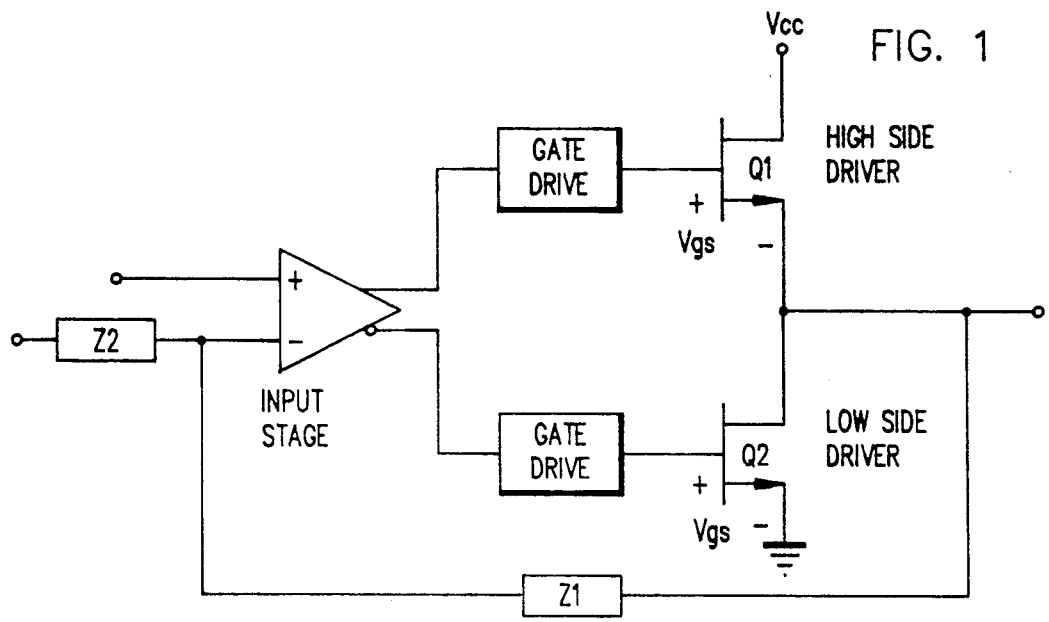
FIG. 1 is a diagrammatic illustration of a basic power amplifier configuration.

While the invention is susceptible to various modifications and alternative forms, specific embodiments thereof have been shown by way of example in the drawings and will herein be described in detail. It should be understood, however, that it is not intended to limit the invention to the particular form disclosed, but, on the contrary, the intention is to cover all modifications, equivalents, and alternatives falling within the spirit and scope of the invention, as defined by the appended claims.

FIG. 1 shows the block diagram of a class B or AB linear power amplifier using power NMOS transistors for the high-side and low-side drivers. The amplifier is used in a closed loop configuration with the transfer function equal to Z1/Z2. Since the source of the high side transistor, Q1, can swing from ground to Vcc, its gate driver must be a floating driver. It must be able to control the gate voltage, Vgs, independent of the level of the source.

Figure 2:
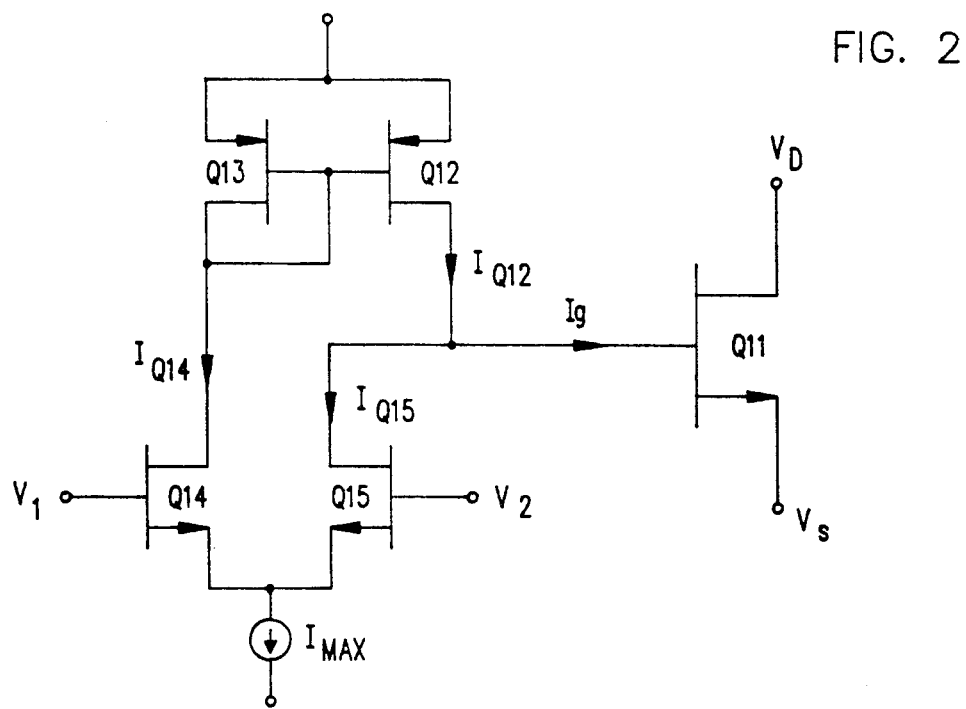
FIG. 2 shows a driver in accordance with the present invention using a differential current stage.
Figure 3:
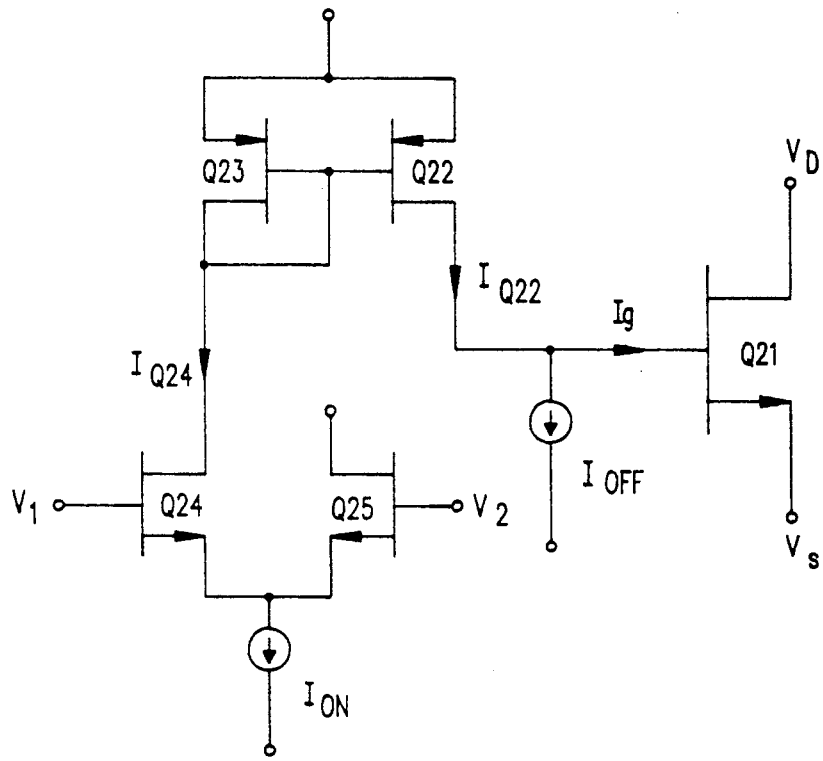
FIG. 3 shows a driver in accordance with the present invention using a single ended current stage with fixed turnoff current.

FIGS. 2 and 3 show two embodiments of driver circuits in accordance with the invention. An input differential transconductance stage is used to generate the bidirectional gate drive current in each embodiment.

FIG. 2 shows a differential current drive for a transistor Q11. Transistor Q11 corresponds to transistor Q1 or Q2 in FIG. 1, both of which are coupled to their own gate drive. Q14 and Q15 form a differential pair which is biased by the current source Imax. The gain of the differential pair is determined by the transconductance of Q14 and Q15. The current in Q14 is inverted by the current mirror Q13 and Q12 such that Iq14 is equal to Iq12. The current in Q12 is then summed with the current in Q15; the net current is Ig. If the two inputs are balanced (V1=V2), then Ig=Iq14−Iq15=0. During linear operation Ig=gm(V1−V2), where gm is the transconductance of Q14 and Q15. For large differential input voltages Ig is limited by Imax. If (V1−V2)>Imax/gm, then Ig(max)=Imax, and if (V1−V2)<-Imax/gm, then Ig(min)=-Imax. The result is a bidirectional current source with no crossover distortion whose output is controlled by a differential input voltage. This gate driver can be used to drive either a high or low side switch, for example, Q1 or Q2 of FIG. 1, since the output current is independent of the output voltage. Voltage VD is the drain voltage of transistor Q11 and voltage VS is the source voltage of transistor Q11.

FIG. 3 shows a second method of implementing the gate driver. The gate driver drives a transistor Q21 which corresponds to transistor Q1 or Q2 of FIG. 1. Voltage VD is the drain voltage of transistor Q21 and VS is the source voltage of transistor Q21. In this embodiment, a constant turn off current, Ioff, is connected to the gate of the power device. The differential pair, Q24 and Q25, are biased by a current source, Ion. The output of Q24 is inverted by the current mirror Q22 and Q23, such that Iq24 is equal to Iq22. The current in Q22 is then summed with the turn off current, Ioff; Ig=Iq24−Ioff. If the differential input voltage is such that Iq24 equals Ioff, then Ig equals zero. During linear operation, Ig=gm(V1−V2)/2−Ioff. The maximum value of Ig=Ion−Ioff, and if Ion=2×Ioff, then Ig(max)=Ioff. The minimum value of Ig(min) is −Ioff. By varying the magnitudes of Ion and Ioff, the maximum and minimum values of Ig may be controlled independently.

Figure 4:
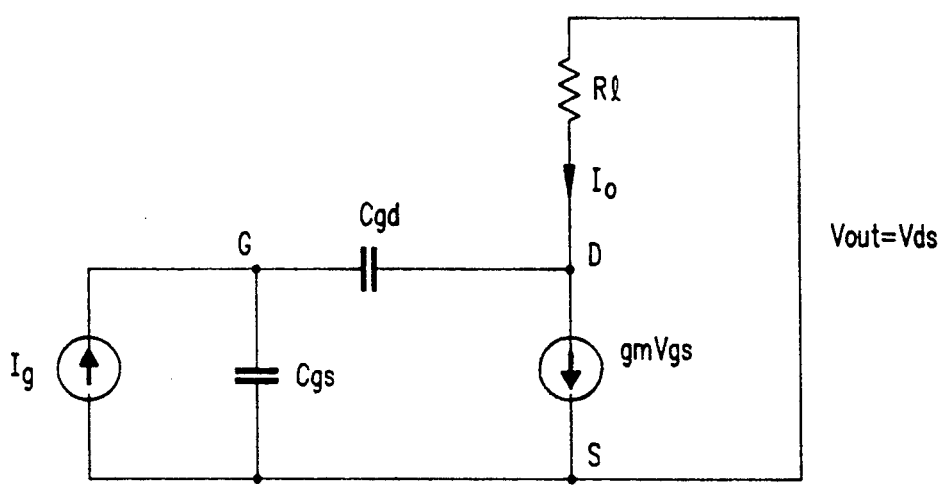
FIG. 4 is a small signal circuit model of an amplifier using a power MOS transistor such as Q1 of FIG. 1.

FIG. 4 shows a small signal model of one form of the invention. The MOS gate current, Ig, is equal to the input voltage, V1−V2, times the transconductance of the differential input stage times any multipliers due to current mirror gains. The derivation of the small signal transfer function is given below.

$$Io = gm\ Vgs$$

where:
Io is the small signal output current of the MOS power device.
gm is the transconductance gain of the MOS power device.
Vgs is the gate to source voltage of the MOS power device.
Find Vgs in terms of Ig.

$$Ig = Vgs/(1/sCgs) + ((Vgs − Vds)/(1/sCgd))$$
$$= sVgsCgs + s(Vgs − Vds)Cgd$$

$$s(Cgs + Cgd)Vgs = Ig + sCgdVds$$

$$Vgs = (Ig + sCgdVds)/s(Cgs + Cgd)$$

Substitute into the first equation.

$$Io = gm(Ig + sCgdVds)/s(Cgs + Cgd)$$

$$s(Cgs + Cgd)Io = gmIg + sCgd(gmVgs)$$

$$Vds = −IoR1$$

$$gmIg = Io(s(Cgs + Cgd) + s(gmR1Cgd))$$

$$Io/Ig = gm/s(Cgs + Cgd(1 + gmR1))$$

$$Vout/Ig = (1/s) \times (gmR1/(Cgs + Cgd(1 + gmR1))$$

The unity gain crossover point is:

$$Vout/Ig = 1$$

$$2 \times (pi) \times Fo = gmR1/(Cgs = Cgd(1 + gmR1)$$

$$Fo = gm\ R1/(2 \times (pi) \times (Cgs + Cgd(1 + gmR1)))$$

Figure 5:
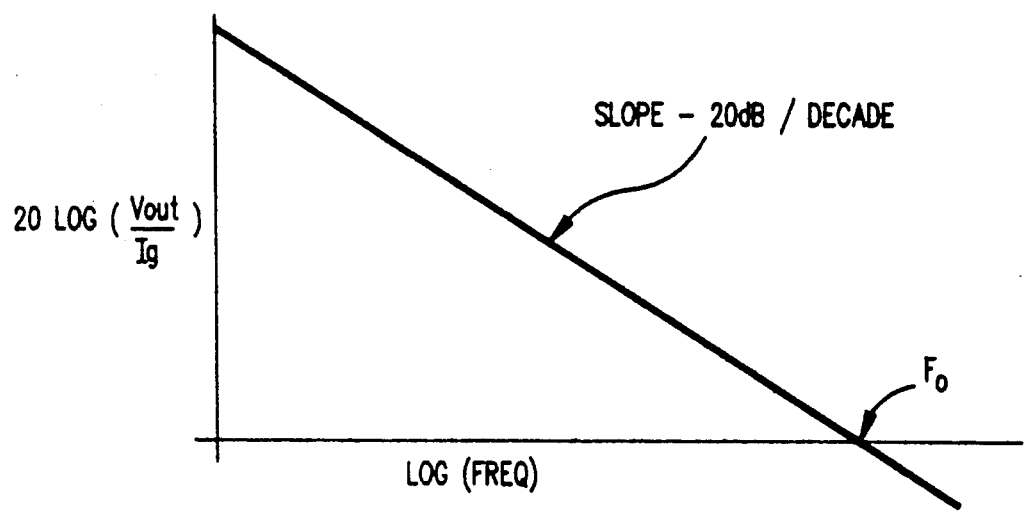
FIG. 5 is an illustration of the small signal transfer function for the circuit model of FIG. 4.

A Bode plot of the transfer function is given in FIG. 5. The DC gain of the transfer function is infinite in theory. In practice it is limited by the output impedance of the current source Ig and whatever input leakage may be present on the gate of the power device.

The small signal transfer function is that of an integrator with a unity gain crossover point of Fo. By changing the transconductance of the differential input stage, the gain of the open loop transfer function may be raised or lowered.

The derivation of the large signal slew rate is given below. The slew rate is limited by the maximum gate drive current Ig(max).

$$Vout/Ig = (1/s) \times (gmR1/(Cgs + Cgd(1 + gmR1))$$

$$sVout = Ig \times (gmR1/(Cgs + Cgd(1 + gmR1))$$

Substitute Ig=Ig(max) to find slew rate.

$$sVout = Ig(max) \times (gmR1/(Cgs + Cgd(1 + gmR1))$$

If the load is a current source (i.e. inductive), then R1 is very large and the expression may be simplified.

$$\begin{aligned}sVout &= Ig(max) \times (gmR1/(Cgd(gmR1))) \\ &= Ig(max) \times (1/Cgd)\end{aligned}$$

By adjusting the maximum (or minimum) gate drive current, the slew rate of the amplifier may be adjusted for either high or low performance. Ig(max) controls the turn on voltage slew rate and Ig(min) controls the turn off slew rate. These parameters may be independently controlled.

Figure 6A:
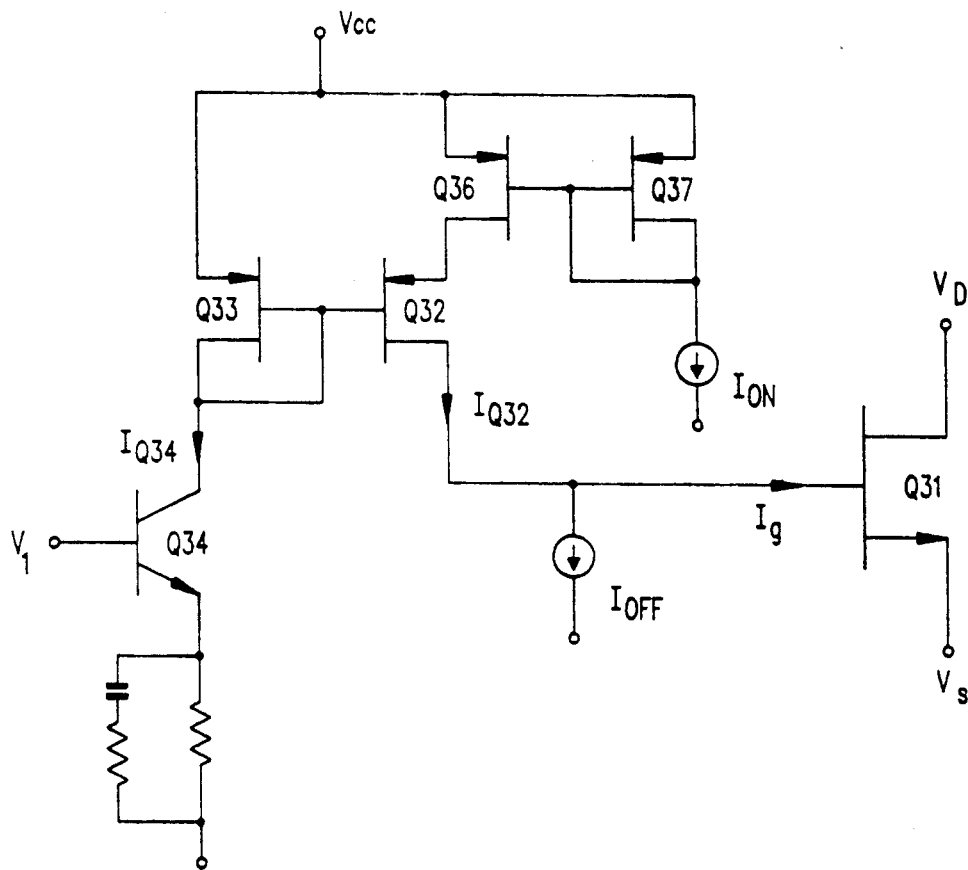
FIGS. 6A and 6B are a circuit diagram and illustration of transfer function for a slew rate limiting circuit with fixed turnoff current, respectfully.
Figure 6B:
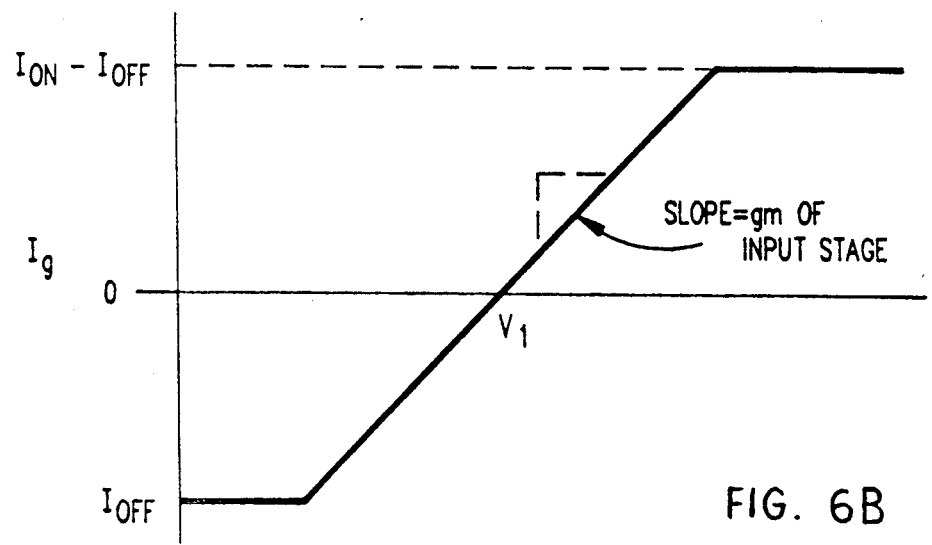

Sometimes it is not practical or possible to control the maximum gate current with a differential input stage. FIG. 6 illustrates an implementation of a gate drive for a transistor Q31, where the input voltage is a single ended rather than a differential voltage. Transistor Q31 corresponds to transistor Q1 or Q2 in FIG. 1. Voltage VD is the drain voltage of transistor Q31 and voltage VS is the source voltage of transistor Q31. In this implementation, it would be difficult to control the maximum current in Q34. For this application, a second method of limiting Ig(max) is used. The inverting current mirror, Q33–Q32, is modified by connecting the output of a second current mirror, Q37–Q36, between the source of Q32 and Vcc. In order to simplify the discussion, it is assumed that both current mirrors have a gain of one.

If Iq34 is less than Ion, then the drain to source voltage of Q36 will be small and Iq32 will be equal to Iq34. However, as Iq34 increases such that Iq34 is greater than Ion, then the current in Q32 is limited to the value of the current source Ion. This enables the turn on and turn off slew rates to be controlled by two current sources that are independent of the input transconductance stage.

Figure 7A:
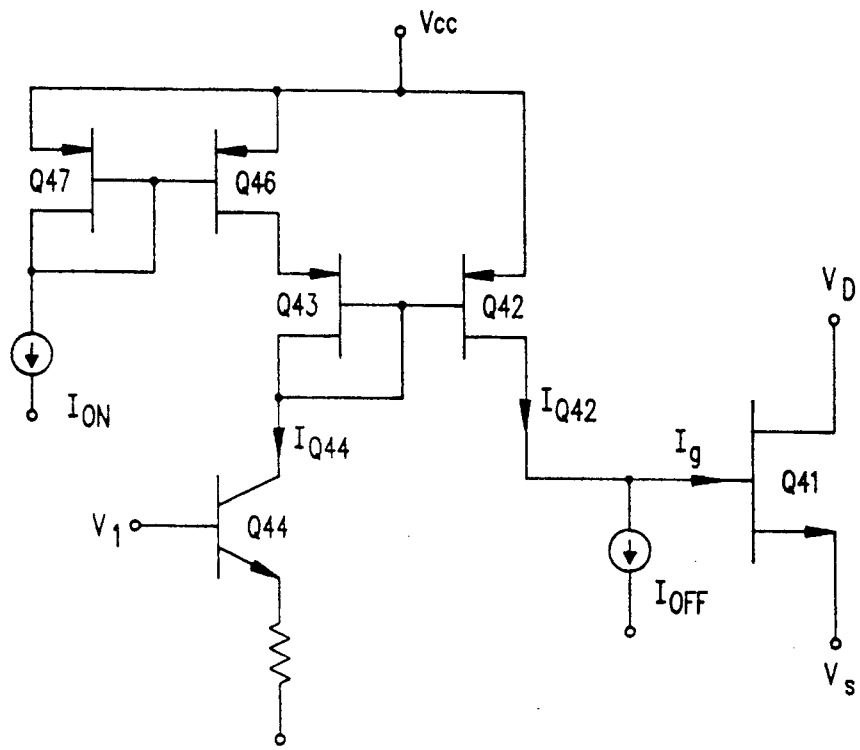
FIGS. 7A and 7B are a circuit diagram and illustration of transfer function for a slew rate enhancement circuit with fixed turnoff current, respectfully.
Figure 7B:
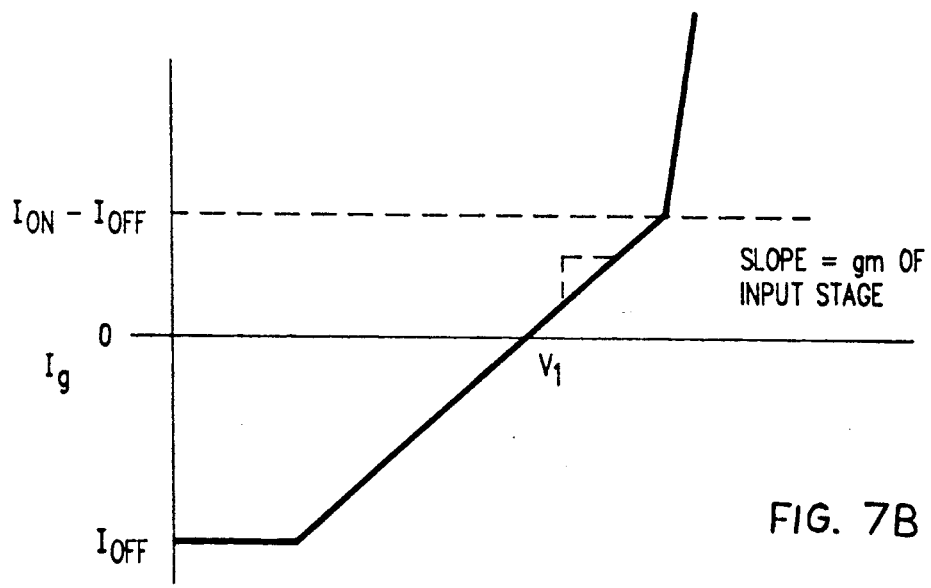

In some applications it may be desirable to increase rather than limit the slew rate of the amplifier. FIG. 7 shows an embodiment of this feature. The inverting mirror, Q43–Q42, is modified by connecting the output of the second current mirror, Q47–Q46, between the source of Q43 and Vcc. As long as Iq44 is less than Ion, Iq42 will be equal to Iq44. But when Iq44 is greater than Ion, the gate to source voltage of Q42 becomes greater than the gate to source voltage of Q3 and Iq42 becomes much greater than Iq44. Transistor Q41 corresponds to transistor Q1 or Q2 in FIG. 1. Voltage VD is the drain voltage of transistor Q41 and voltage VS is the source voltage of transistor V41.

Both of the previous methods for controlling the slew rate can be used to provide symmetrical slew rates with a differential current drive.

What is claimed is:

1. A bidirectional current source gate driver for a power MOSFET comprising:
   means responsive to an input voltage for providing a first current;
   first current mirror means responsive to said first current for providing at the output of said first current mirror means, a second current proportional to said first current;
   first current source means for providing a third current;
   second current mirror means responsive to said third current for providing at the output of said second current mirror means, a fourth current proportional to said third current, an output of said first current mirror means and an output of said second current mirror means connected in series, so that the smaller of the second and fourth currents flows through the series combination, said series connected outputs of said first current mirror means and said second current mirror means second and fourth currents connected to the gate of the power MOSFET; and
   second current source means for providing a current also connected to the gate of the power MOSFET, with the difference between the current provided by said second current source means and the lesser of the second and fourth currents being supplied to the gate of the power MOSFET, so that the value of the third current provided by the first current source means limits the slew rate of the power MOSFET.

2. The bidirectional current source gate driver of claim 1 where said power MOSFET comprises an NMOS transistor.

3. The bidirectional current source gate driver of claim 2 where said gate driver and power MOSFET are integrated on a common substrate.

4. A bidirectional current source gate driver for a power MOSFET comprising:
   means responsive to an input voltage for providing a first current;
   first current mirror means for providing a second current;
   first current source means for providing a third current;
   second current mirror means responsive to said third current for providing a fourth current proportional to the third current, an input of said first current mirror, an output of said second current mirror, and said means responsive to an input voltage connected in series with one another and to the gate of the power MOSFET, so that the second current in the output of the first current mirror means is proportional to the first current when the first current is less than the fourth current with a first proportionality constant, and the second current in the output of the first current mirror means is proportional to the first current when the first current is greater than the fourth current with a second proportionality constant greater than the first proportionality constant; and
   second current source means for providing a current also connected to the gate of the power MOSFET, with the difference between the current provided by the second current source means and the second current being supplied to the gate of the power MOSFET, so that the value of the third current provided by the first current source means enhances the positive slew rate of the power MOSFET.

5. The bidirectional current source gate driver of claim 4 where said power MOSFET comprises an NMOS transistor.

6. The bidirectional current source gate driver of claim 5 where said gate drive and power MOSFET are integrated on a common substrate.

* * * * *